(12) United States Patent
Kang et al.

(10) Patent No.: US 10,298,204 B2
(45) Date of Patent: May 21, 2019

(54) ACOUSTIC WAVE FILTER DEVICE, PACKAGE TO MANUFACTURE ACOUSTIC WAVE FILTER DEVICE, AND METHOD TO MANUFACTURE ACOUSTIC WAVE FILTER DEVICE

(71) Applicant: Samsung Electro-Mechanics Co., Ltd., Suwon-si (KR)

(72) Inventors: Yun Sung Kang, Suwon-si (KR); Ji Hye Nam, Suwon-si (KR); Kwang Su Kim, Suwon-si (KR); Pil Joong Kang, Suwon-si (KR); Jeong Il Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 128 days.

(21) Appl. No.: 15/271,646

(22) Filed: Sep. 21, 2016

(65) Prior Publication Data

US 2017/0237410 A1   Aug. 17, 2017

(30) Foreign Application Priority Data

Feb. 17, 2016   (KR) .................. 10-2016-0018303

(51) Int. Cl.
  *H03H 9/54*   (2006.01)
  *H03H 9/64*   (2006.01)
  *H01L 41/29*   (2013.01)
  *H03H 9/10*   (2006.01)

(52) U.S. Cl.
  CPC ............... *H03H 9/54* (2013.01); *H01L 41/29* (2013.01); *H03H 9/1014* (2013.01); *H03H 9/1064* (2013.01); *H03H 9/64* (2013.01)

(58) Field of Classification Search
  CPC ............... H03H 9/54; H03H 9/64; H03H 9/72
  USPC .......................... 333/133, 187, 193
  See application file for complete search history.

(56) References Cited

U.S. PATENT DOCUMENTS

| 6,710,682 | B2* | 3/2004 | Onishi | H03H 9/02559 |
| | | | | 29/25.35 |
| 7,498,900 | B2* | 3/2009 | Lee | H01L 27/0805 |
| | | | | 333/133 |
| 7,635,636 | B2* | 12/2009 | McClure | H03H 9/059 |
| | | | | 438/106 |
| 2007/0058003 | A1* | 3/2007 | Aoki | H03H 9/0547 |
| | | | | 347/68 |
| 2012/0068690 | A1* | 3/2012 | Song | G01N 29/022 |
| | | | | 324/76.39 |

FOREIGN PATENT DOCUMENTS

| JP | 08213874 A | * | 8/1996 |
| JP | 2003-69378 A | | 3/2003 |
| JP | 2008-252065 A | | 10/2008 |
| KR | 10-2007-0016855 A | | 2/2007 |

\* cited by examiner

*Primary Examiner* — Dean O Takaoka
(74) *Attorney, Agent, or Firm* — NSIP Law

(57) ABSTRACT

An acoustic wave filter device includes a base comprising an acoustic wave filter part formed on one surface thereof and including a bonding part formed to surround the acoustic wave filter part, and a cap including a depression groove formed therein and a bonding counterpart formed to correspond to the bonding part. The depression groove is positioned over the acoustic wave filter part. The bonding part and the bonding counterpart receive a voltage to deform and bond the bonding part and the bonding counterpart to each other.

11 Claims, 4 Drawing Sheets

ACOUSTIC WAVE FILTER DEVICE, PACKAGE TO MANUFACTURE ACOUSTIC WAVE FILTER DEVICE, AND METHOD TO MANUFACTURE ACOUSTIC WAVE FILTER DEVICE

CROSS-REFERENCE TO RELATED APPLICATIONS

This application claims benefit under 35 USC 119(a) of priority to Korean Patent Application No. 10-2016-0018303 filed on Feb. 17, 2016 in the Korean Intellectual Property Office, the disclosure of which is incorporated herein by reference in its entirety.

BACKGROUND

1. Field

The following description relates to an acoustic wave filter device.

2. Description of Related Art

Recently, a device using a bulk acoustic wave (BAW) filter has played a very important role to enable a miniaturization, a multi-functionalization, and improvements in a performance of wireless communications systems. In order to realize characteristics of the BAW filter device, a hermetic seal capable of maintaining reliable sealing in a vacuum state so as to block the penetration of moisture is required.

As a result, among bonding technologies generally used at the time of manufacturing the BAW filter device, a wafer level bonding technology has been used to maintain the hermetic seal, including a silicon-silicon (Si—Si) direct bonding technology, a silicon-glass (Si-Glass) anodic bonding technology, and a bonding technology using flit glass.

However, these technologies are not generally appropriate for a package of the BAW filter device due to a high bonding temperature or bad workability.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided an acoustic wave filter device including structural stability and configured to prevent penetration of moisture.

Other features and aspects will be apparent from the following detailed description, the In accordance with an embodiment, there is provided an acoustic wave filter device, including: a base including an acoustic wave filter part formed on one surface thereof and including a bonding part formed to surround the acoustic wave filter part; and a cap including a depression groove formed therein and a bonding counterpart formed to correspond to the bonding part, wherein the depression groove may be positioned over the acoustic wave filter part, wherein the bonding part and the bonding counterpart receive a voltage to deform and bond the bonding part and the bonding counterpart to each other.

The bonding counterpart may be positioned on a rim of the cap, aligned opposite to the bonding part, which may be formed on an upper surface of the base.

The bonding part and the bonding counterpart may be formed of gold (Au).

The bonding part and the bonding counterpart may include a band shape corresponding to a shape of the acoustic wave filter part.

In accordance with another embodiment, there is provided a package to manufacture an acoustic wave filter device, including: a base wafer including acoustic wave filter parts formed on one surface thereof and including bonding parts formed to surround the acoustic wave filter parts; and a cap wafer including depression grooves formed therein and bonding counterparts formed to correspond to the bonding parts, wherein the depression grooves may be positioned over the acoustic wave filter parts, wherein the bonding parts and the bonding counterparts receive a voltage to deform and bond the bonding parts and the bonding counterparts to each other.

The bonding parts and the bonding counterparts may be formed of gold (Au).

The package may further include: first pads to apply a voltage to the bonding parts may be formed on the base wafer, and second pads for applying a voltage to the bonding counterparts may be formed on the cap wafer.

The package may further include: first pads continuously formed on both end portions of a lower surface of the base wafer, on side portions of the base wafer, and on both end portions of an upper surface of the base wafer to apply the voltage to the bonding parts.

The package may further include: first pads formed on both end portions of the lower surface of the base wafer and on both end portions of the upper surface of the base wafer.

The bonding parts and the bonding counterparts may include a shape corresponding to a shape of the acoustic wave filter parts.

The bonding parts may include a quadrangular band shape, and the bonding parts may be connected to each other and may be connected to the first pads.

The bonding counterparts may include a quadrangular band shape, and the bonding counterparts may be connected to each other and may be connected to the second pads.

The bonding counterparts may include a lattice shape, and the depression grooves may be formed between corresponding bonding counterparts.

In accordance with a further embodiment, there is provided a method to manufacture an acoustic wave filter device, including: forming bonding parts and first pads on a base wafer on which acoustic wave filter parts may be formed; forming bonding counterparts and second pads on a cap wafer in which depression grooves may be formed over the acoustic wave filter parts; mounting the base wafer and the cap wafer in a jig and applying pressure and a voltage to the bonding parts and the bonding counterparts to bond the bonding parts and the bonding counterparts to each other; and dividing the base wafer and the cap wafer bonded to each other into acoustic wave filter devices.

The bonding parts and the bonding counterparts may be formed of gold (Au).

The bonding parts and the bonding counterparts may include a shape corresponding to a shape of the acoustic wave filter parts.

The bonding parts may include a quadrangular band shape, and the bonding parts may be connected to each other and may be connected to the first pads.

The bonding counterparts may include a quadrangular band shape, and the bonding counterparts may be connected to each other and may be connected to the second pads.

The bonding parts and the bonding counterparts may be bonded to each other through diffusion-bonding, and may be deformed by the voltage applied thereto.

The voltage applied to the bonding parts and the bonding counterparts may be 300V to 1 kV.
drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
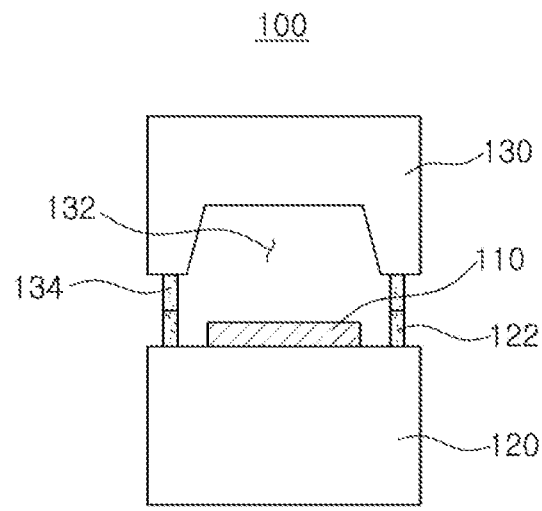
FIG. 1 is a schematic view illustrating an acoustic wave filter device, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a schematic view illustrating an acoustic wave filter device, according to an embodiment.

Referring to FIG. 1, an acoustic wave filter device 100, according to an embodiment, includes an acoustic wave filter part 110, a base 120, and a cap 130.

The acoustic wave filter part 110 is formed on the base 120. As an example, the acoustic wave filter part 110 includes a lower electrode, a piezoelectric body, and an upper electrode, although not illustrated in detail in FIG. 1. Further, the piezoelectric body of the acoustic wave filter part 110 may include a piezoelectric material that may be manufactured using a thin film such as zinc oxide (ZnO) or aluminum nitride (AlN) by way of example.

The acoustic wave filter part 110 is a bulk acoustic wave (BAW) filter. However, the acoustic wave filter part 110 is not limited thereto, and may be selected from wide and different kinds of acoustic wave filters, such as, a BAW filter, a surface acoustic wave (SAW) filter, and/or a stack crystal filter (SCF).

The acoustic wave filter part 110 is formed on one surface of the base 120, and a bonding part 122 is formed to surround the acoustic wave filter part 110. The base 120 is formed by cutting a base wafer 220, to be described below.

In addition, the bonding part 122 is formed on an upper surface of the base 120 so as to enclose or surround the acoustic wave filter part 110.

In one embodiment, the bonding part 122 has a quadrangular band shape, and is formed with a height greater than a height of the acoustic wave filter part 110.

Also, the bonding part 122 may be formed of gold (Au). However, the bonding part 122 is not limited to being formed of the gold, and may also be formed of a material containing the gold (Au).

The cap 130 covers the acoustic wave filter part 110 and upper portions of the base 120, which exclude the acoustic wave filter part 110 and the bonding part 122. The cap 130 has a rim with portions thereof extending towards a direction of the base 120. A depression groove 132 is formed at a position or a location over or corresponding to the acoustic wave filter part 110 in from lower surface of the cap 130, within the rim of the cap 130, towards an interior of the cap 130. In one example, a center of the depression groove 132 is aligned with a center of the acoustic wave filter part 110. A bonding counterpart 134 corresponding to the bonding part 122 is formed beneath the cap 130. The bonding counterpart 134 is formed on the rim (the lower surface) of the cap 130 and is positioned to be aligned opposite to the bonding part 122, which is formed on the upper surface of the base 120.

That is, the acoustic wave filter part 110 is disposed below the depression groove 132 at the time of that the base 120 and the cap 130 are bonded to each other. In addition, the bonding part 122 and the bonding counterpart 134 are disposed to surround the acoustic wave filter part 110 so as to enclose the acoustic wave filter part 110.

That is, the base 120 and the cap 130 are bonded to each other by bonding the bonding part 122 and the bonding counterpart 134 together.

Also, the depression groove 132 is formed so that an area thereof becomes narrow toward a top thereof. In other words, as shown in FIG. 1, the depression groove 132 is formed within the rim of the cap 130, as a cavity within the cap 130, in which a base of the cavity is flat and extends at an angle towards a perimeter of the rim of the cap 130.

In addition, the bonding counterpart 134 may also have a quadrangular band shape, and be formed of gold (Au). However, the bonding counterpart 134 is not limited to being formed of the gold, and may also be formed of a material containing the gold (Au).

In one embodiment, the bonding part 122 and the bonding counterpart 134 are bonded to each other by diffusion-bonding. In this case, a voltage of 300V to 1 kV may be applied to the bonding part 122 and the bonding counterpart 134.

As described above, the voltage is applied to the bonding part 122 and the bonding counterpart 134, and thus, a current flows through a contact part between the bonding part 122 and the bonding counterpart 134, while the bonding part 122 and the bonding counterpart 134 are pressed with a predetermined pressure.

As a result, a temperature is localized and increases at the contact part between the bonding part 122 and the bonding counterpart 134 due to Joule's heat. Yield strength of gold (Au) is reduced due to the rise in the temperature, such that plastic deformation is generated in the bonding part 122 and the bonding counterpart 134.

Therefore, a bonding area between the bonding part 122 and the bonding counterpart 134 is increased.

Further, a driving force of diffusion increases due to a local rise in the temperature to form a dense bonding surface between the bonding part 122 and the bonding counterpart 134, thereby generally uniformly bonding the bonding part 122 and the bonding counterpart 134 to each other.

As described above, the voltage is applied to the bonding part 122 and the bonding counterpart 134 to densely bond the bonding part 122 and the bonding counterpart 134 to each other, without generating pores or micro-defects. In addition, a bulk acoustic wave filter device is manufactured to prevent deterioration of the acoustic wave filter part 110.

In addition, because the bonding part 122 and the bonding counterpart 134 are densely bonded to each other as described above, the bulk acoustic wave filter device is structurally stable, and penetration of moisture into the acoustic wave filter part after the bulk acoustic wave filter device is manufactured is blocked.

Figure 2:
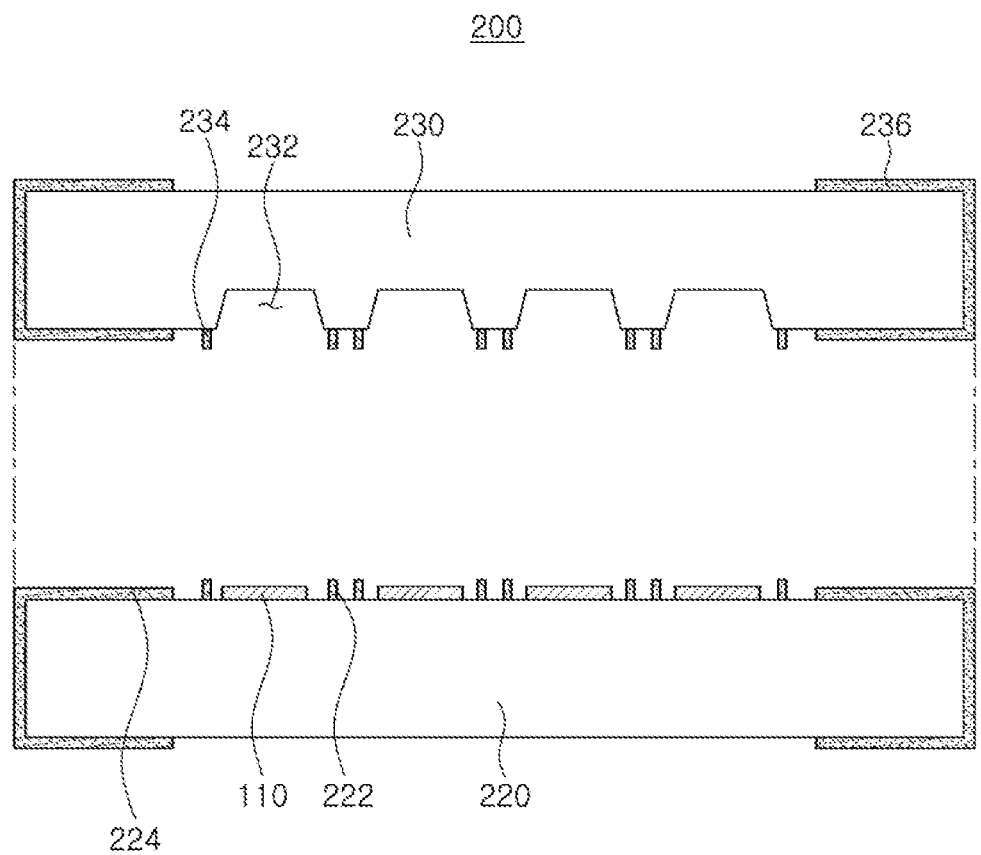
FIG. 2 is a schematic view illustrating a package to manufacture the acoustic wave filter device, according to an embodiment.
Figure 3:
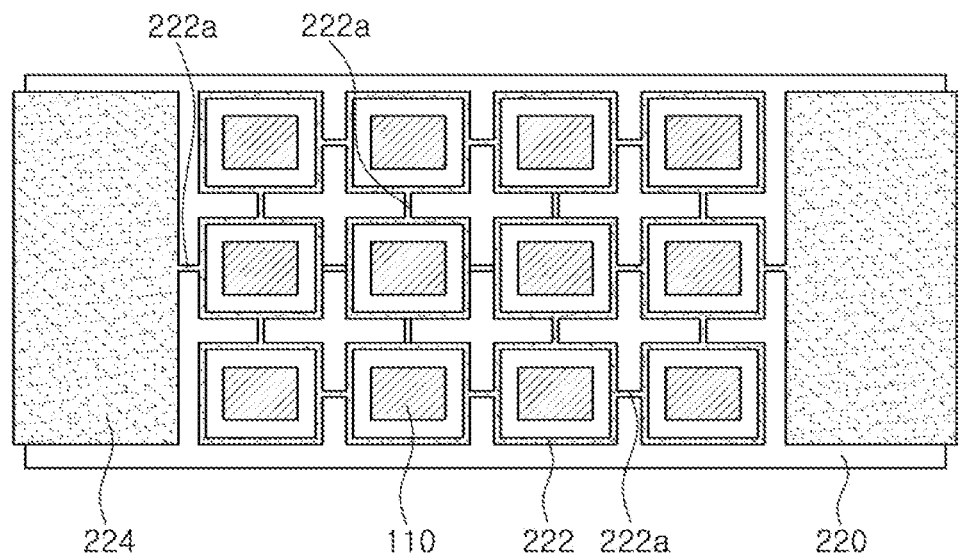
FIG. 3 is a plan view illustrating a base wafer included in the package to manufacture the acoustic wave filter device, according to an embodiment.
Figure 4:
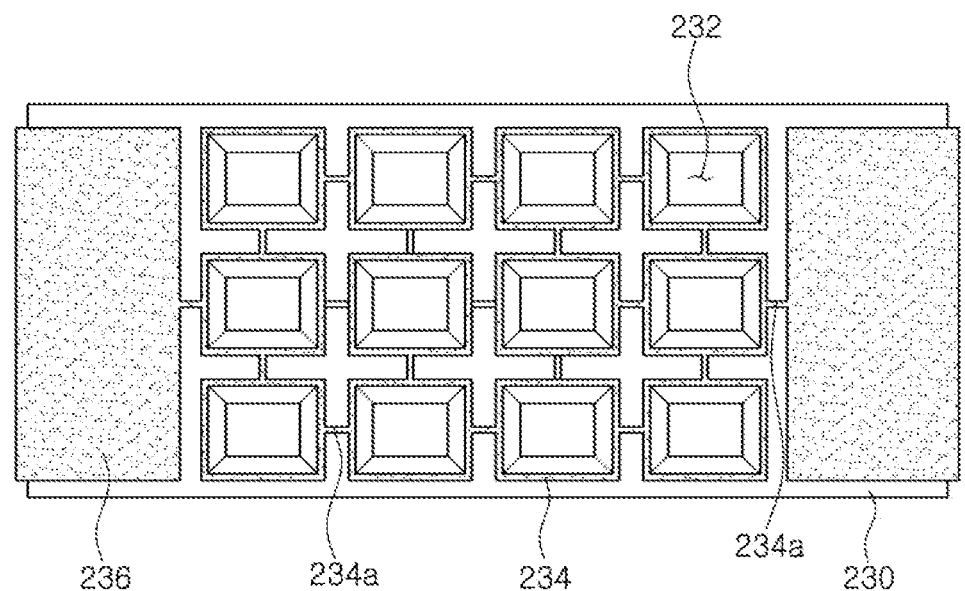
FIG. 4 is a bottom view illustrating a cap wafer included in the package to manufacture the acoustic wave filter device, according to an embodiment.

FIG. 2 is a schematic view illustrating a package to manufacture an acoustic wave filter device, according to an embodiment. FIG. 3 is a plan view illustrating a base wafer included in the package to manufacture an acoustic wave filter device, according to an embodiment. FIG. 4 is a bottom view illustrating a cap wafer included in the package to manufacture an acoustic wave filter device, according to an embodiment.

Referring to FIGS. 2 through 4, a package 200 to manufacture an acoustic wave filter device, according to an embodiment, includes acoustic wave filter parts 110, a base wafer 220, and a cap wafer 230.

One or more acoustic wave filter parts 110 are formed on the base wafer 220. As illustrated in FIG. 3, a plurality of acoustic wave filter parts 110 are formed on the base wafer 220 in columns and rows patterns or formation.

The acoustic wave filter part 110 may include a lower electrode, a piezoelectric body, and an upper electrode although not illustrated in detail in FIG. 2, as described above.

In an example, the piezoelectric body may include a piezoelectric material that may be manufactured using a thin film such as zinc oxide (ZnO) or aluminum nitride (AlN).

The acoustic wave filter part 110 is formed of a bulk acoustic wave (BAW) filter. However, the acoustic wave filter part 110 is not limited thereto, and may be selected from wide and different kinds of acoustic wave filters, including, but limited to, a BAW filter, a surface acoustic wave (SAW) filter, and/or a stack crystal filter (SCF).

The one or more acoustic wave filter parts 110 is formed on one surface of the base wafer 220, and bonding parts 222 are formed to surround the acoustic wave filter parts 110. The bonding parts 222 may have a lattice shape. That is, the acoustic wave filter parts 110 may be formed at central portions of the bonding parts 220 having the lattice shape.

In addition, first pads 224 are continuously formed on both end portions of a lower surface of the base wafer 220, on side portions of the base wafer 220, and on both end portions of an upper surface of the base wafer 220 so as to apply a voltage to the bonding parts 222. In an alternative embodiment, the first pads 224 are formed on both end portions of the lower surface of the base wafer 220 and on both end portions of the upper surface of the base wafer 220.

In addition, the first pads 224 and the bonding parts 222 are electrically connected to each other. In one configuration, the bonding parts 222 having the lattice shape are electrically connected to each other.

Further, a height of the bonding part 222 is greater than a thickness of the acoustic wave filter part 110.

In accordance with an embodiment, the bonding part 222 and the first pad 224 are formed of gold (Au). However, the bonding part 222 and the first pad 224 are not limited to being formed of the gold, and may also be formed of a material containing the gold (Au).

Depression grooves 232 are formed in positions corresponding to the acoustic wave filter parts 110 in the cap wafer 230, and bonding counterparts 234 corresponding to the bonding parts 222 are formed beneath the cap wafer 230.

That is, the acoustic wave filter parts 110 is disposed below the depression grooves 232 at the time of bonding the base wafer 220 and the cap wafer 230 to each other. In addition, the bonding parts 222 and the bonding counterparts 234 are disposed to surround the acoustic wave filter parts 110 so as to enclose the acoustic wave filter parts 110.

In other words, the bonding counterparts 234 have a lattice shape, and the depression grooves 232 are formed at central portions of the bonding counterparts 234.

The depression groove 232 are formed so that an area thereof becomes narrow toward the top.

Further, second pads 236 are continuously formed from both end portions of an upper surface of the cap wafer 230, on side portions of the cap wafer 230, and both end portions of a lower surface of the cap wafer 230 through which a voltage is applied to the bonding counterparts 234. In an alternative embodiment, the second pads 236 are formed on both end portions of the lower surface of the cap wafer 230 and on both portions of the upper surface of the cap wafer 230.

In addition, the second pads 236 and the bonding counterparts 234 may be electrically connected to each other. In addition, the bonding counterparts 234 having the lattice shape may be electrically connected to each other.

The bonding counterpart 234 and the second pad 236 may be formed of gold (Au). However, the bonding counterpart 234 and the second pad 236 are not limited to being formed of the gold, and may also be formed of a material containing the gold (Au).

A scheme to bond the base wafer 220 to the cap wafer 230, in other words, a scheme to bond the bonding parts 222 to the bonding counterparts 234 will be described.

First, the base wafer 220 and the cap wafer 230 is mounted on a jig 10 (see FIG. 5), respectively. Then, the jig 10 applies a preset pressure and temperature to the base wafer 220 and the cap wafer 230.

In an example, a voltage of 300V to 1 kV is applied from the first and second pads 224 and 236 to the bonding parts 222 and the bonding counterparts 234, respectively.

As described above, the voltage is applied to the bonding part 222 and the bonding counterpart 234. A current flows through a contact part between the bonding part 222 and the bonding counterpart 234 while the bonding part 222 and the bonding counterpart 234, while being pressed at a predetermined pressure and temperature.

As a result, a temperature may locally rise at the contact part between the bonding part 222 and the bonding counterpart 234 due to Joule's heat, and yield strength of gold (Au) is reduced due to the rise in the temperature, such that plastic deformation is generated between the bonding part 222 and the bonding counterpart 234.

Therefore, a bonding area between the bonding part 222 and the bonding counterpart 234 may be increased.

Further, driving force of diffusion may also be increased due to the localized increase or rise in the temperature to form a dense bonding surface between the bonding part 222 and the bonding counterpart 234, as a result, the bonding part 222 and the bonding counterpart 234 are uniformly bonded to each other.

As described above, the voltage is applied to the bonding part 222 and the bonding counterpart 234 to densely bond the bonding part 222 to the bonding counterpart 234 without generating pores or micro-defects. In addition, a bulk acoustic wave filter device having a limitation in a bonding temperature due to deterioration of the acoustic wave filter part 110 is manufactured.

In addition, because the bonding part 222 and the bonding counterpart 234 are densely bonded to each other as described above, the bulk acoustic wave filter device is structurally stable, and penetration of moisture into the acoustic wave filter part 110 after the bulk acoustic wave filter device is manufactured may be blocked.

Hereinafter, a method to manufacture an acoustic wave filter device, according to an embodiment, will be described with reference to FIGS. 5 and 6.

Figure 5:
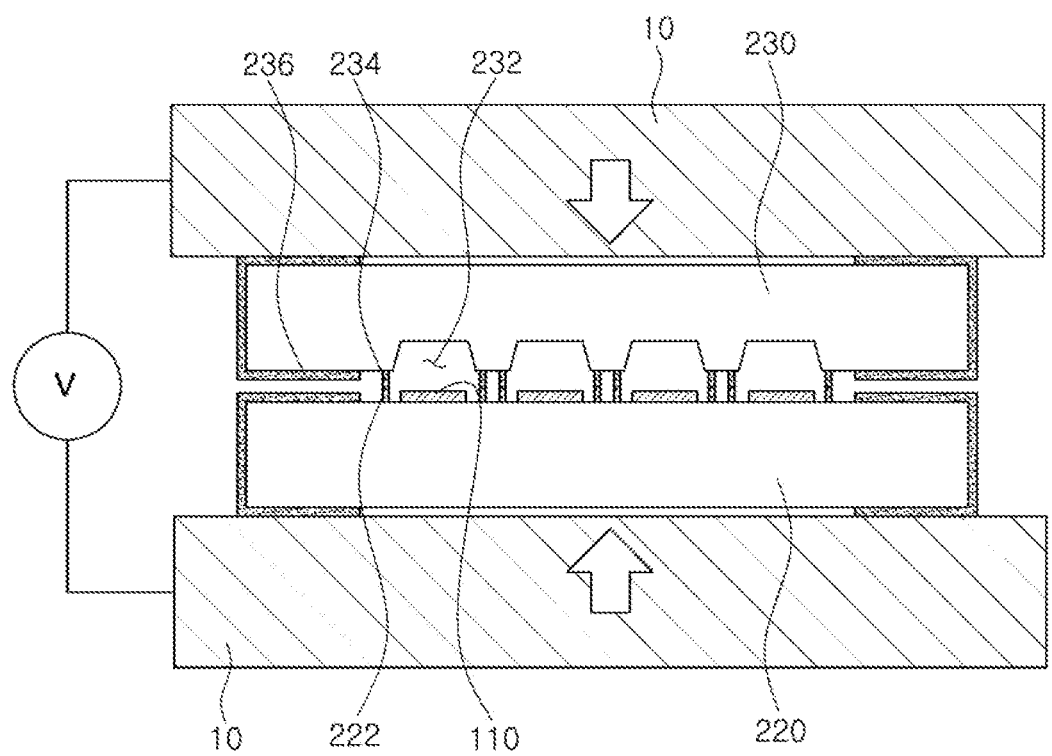
FIGS. 5 and 6 are views for describing a method to manufacture the acoustic wave filter device, according to an embodiment.
Figure 6:
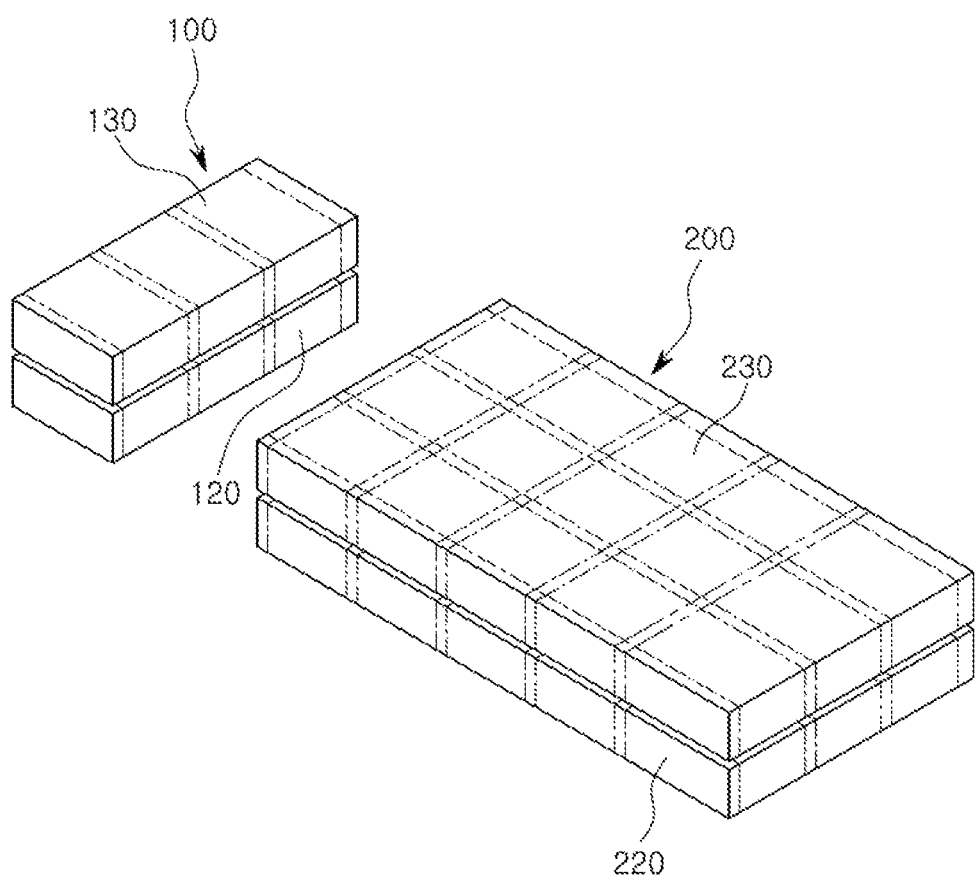

FIGS. 5 and 6 are views for describing a method to manufacture an acoustic wave filter device, according to an embodiment.

First, the bonding parts 222 and the first pads 224 are formed on an upper surface of the base wafer 220 onto which one or more acoustic wave filter parts 110 are formed. Also, the bonding parts 222 are formed to enclose the surrounding of the acoustic wave filter parts 110, and include a lattice shape, by way of example. That is, the bonding part 222 may have a quadrangular ring shape in which the acoustic wave filter parts 110 are disposed at central portions thereof, and a plurality of bonding parts 222 are distributed along a portion of the upper surface of the base wafer 220 to form columns and rows.

In addition, the plurality of bonding parts 222 are electrically connected to each other.

The first pads 224 are formed on both end portions of a lower surface of the base wafer 220 and both end portions of the upper surface of the base wafer 220. In addition, the bonding parts 222 and the first pads 224 may be electrically connected to each other.

Furthermore, the bonding part 222 and the first pad 224 may be formed of gold (Au). However, the bonding part 222 and the first pad 224 are not limited to being formed of the gold, and may also be formed of a material containing the gold (Au).

In addition, the bonding counterparts 234 is formed on a lower surface of the cap wafer 230. That is, the bonding counterparts 234 are formed to enclose the surrounding of the depression grooves 232, and have a lattice shape, by way of example. That is, the bonding counterpart 234 may also have a quadrangular ring shape in which the depression grooves 232 are disposed at central portions thereof, and a plurality of bonding counterparts 234 may be disposed to form columns and rows. In other words, the bonding part 222 and the bonding counterparts 234 may have shapes corresponding to each other.

In addition, the plurality of bonding counterparts 234 may be electrically connected to each other.

The second pads 236 is formed on both end portions of the cap wafer 230 and both end portions of the upper surface of the cap wafer 230. In addition, the bonding counterparts 234 and the second pads 236 may be electrically connected to each other.

Meanwhile, the bonding counterpart 234 and the second pad 236 may be formed of gold (Au). However, the bonding counterpart 234 and the second pad 236 are not limited to being formed of the gold, and may also be formed of a material containing the gold (Au).

Then, as illustrated in FIG. 5, the base wafer 220 and the cap wafer 230 are mounted on the jig 10. In addition, the jig 10 applies a predetermined temperature and a predetermined pressure to the bonding parts 222 and the bonding counterparts 234. Further, a voltage of 300V to 1 kV is applied to the bonding parts 222 and the bonding counterparts 234 through an external power supply. However, although a voltage range of 300V to 1 kV is applied to the bonding parts 222 and the bonding counterparts 234, other voltages lower than 300 V and greater than 1 kV may be also applied.

As described above, the voltage is applied to the bonding part 222 and the bonding counterpart 234 and, as a result, a current flows through a contact part between the bonding part 222 and the bonding counterpart 234 while the bonding part 222 and the bonding counterpart 234 are pressed at a predetermined pressure and temperature.

As a result, a temperature may locally rise at the contact part between the bonding part 222 and the bonding counterpart 234 due to Joule's heat, and yield strength of gold (Au) may be reduced due to the rise in the temperature, such that plastic deformation is generated in the bonding part 222 and the bonding counterpart 234.

Therefore, a bonding area between the bonding part 222 and the bonding counterpart 234 increases.

Further, driving force of diffusion may also be increased due to the local rise in the temperature to form a dense bonding surface between the bonding part 222 and the bonding counterpart 234, thus, uniformly bonding the bonding part 222 and the bonding counterpart 234 to each other.

As described above, the voltage is applied to the bonding part 222 and the bonding counterpart 234 to densely bond the bonding part 222 and the bonding counterpart 234 to each other without generating pores or micro-defects. In addition, a bulk acoustic wave filter device includes a bonding temperature that controls an amount of deterioration of the acoustic wave filter part 110.

In addition, because the bonding part 222 and the bonding counterpart 234 may be densely bonded to each other as described above, the bulk acoustic wave filter device is structurally stable, and penetration of moisture into the acoustic wave filter part 110 after the bulk acoustic wave filter device is manufactured is effectively blocked.

Then, the base wafer 220 and the cap wafer 230 bonded to each other may be sawn as illustrated in FIG. 6. That is, the base wafer 220 and the cap wafer 230 bonded to each other is divided into unit acoustic wave filter devices 100 through a sawing process. In an example, connection parts 222a connecting the bonding parts 222 to each other and connection parts 234a connecting the bonding counterparts 234 to each other may be removed in the sawing process.

In the acoustic wave filter device 100 manufactured through the process described above, the base 120 and the cap 130 are densely bonded to each other. Therefore, the acoustic wave filter device 100 is structurally stable, and penetration of moisture into the acoustic wave filter part 110 after the acoustic wave filter device is manufactured is blocked.

Further, the acoustic wave filter device 100 may be easily manufactured, such that a reduction in a yield of the acoustic wave filter device 100 is prevented.

As set forth above, according to an embodiment, the acoustic wave filter device is structural stable and prevents penetration of moisture.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic wave filter device, comprising:
   a base comprising an acoustic wave filter part formed on one surface thereof, and further comprising a bonding part formed to surround the acoustic wave filter part;
   a cap comprising a depression groove positioned over the acoustic wave filter part, and further comprising a bonding counterpart formed to correspond to the bonding part; and
   either one or both of a first pad formed on an end portion of a lower surface of the base, on a side portion of the base, and on an end portion of an upper surface of the base to apply a voltage to the bonding part, and a second pad formed on an end portion of a lower surface of the cap, on a side portion of the cap, and on an end portion of an upper surface of the cap to apply the voltage to the bonding counterpart,
   wherein the bonding part and the bonding counterpart are configured to receive the voltage to deform and bond to each other.

2. The acoustic wave filter device of claim 1, wherein the bonding counterpart is positioned on a rim of the cap, aligned opposite to the bonding part, which is formed on an upper surface of the base.

3. The acoustic wave filter device of claim 1, wherein the bonding part and the bonding counterpart are formed of gold (Au).

4. The acoustic wave filter device of claim 3, wherein the bonding part and the bonding counterpart comprise a band shape corresponding to a shape of the acoustic wave filter part.

5. A package to manufacture an acoustic wave filter device, comprising:
   a base wafer comprising acoustic wave filter parts formed on one surface thereof, and further comprising bonding parts formed to surround the acoustic wave filter parts;
   a cap wafer comprising depression grooves positioned over the acoustic wave filter parts, and further comprising bonding counterparts formed to correspond to the bonding parts; and
   either one or both of a first pad formed on an end portion of a lower surface of the base wafer, on a side portion of the base wafer, and on an end portion of an upper surface of the base wafer to apply a voltage to the bonding, and a second pad formed on an end portion of a lower surface of the cap wafer, on a side portion of the cap water, and on an end portion of an upper surface of the cap wafer to apply the voltage to the bonding counterparts,
   wherein the bonding parts and the bonding counterparts are configured to receive the voltage to deform and bond to each other.

6. The package of claim 5, wherein the bonding parts and the bonding counterparts are formed of gold (Au).

7. The package of claim 5, wherein the bonding parts and the bonding counterparts comprise a shape corresponding to a shape of the acoustic wave filter parts.

8. The package of claim 7, wherein the package comprises the first pad, the bonding parts comprise a quadrangular band shape, and the bonding parts are connected to each other and are connected to the first pad.

9. The package of claim 7, wherein the package comprises the second pad, the bonding counterparts comprise a quadrangular band shape, and the bonding counterparts are connected to each other and are connected to the second pad.

10. The package of claim 5, wherein the bonding counterparts comprise a lattice shape, and the depression grooves are formed between corresponding bonding counterparts.

11. A package to manufacture an acoustic wave filter device, comprising:
   a base wafer comprising acoustic wave filter parts formed on one surface thereof, and further comprising bonding parts formed to surround the acoustic wave filter parts;
   a cap wafer comprising depression grooves positioned over the acoustic wave filter parts, and further comprising bonding counterparts formed to correspond to the bonding parts; and
   pads continuously formed on end portions of a lower surface of the base wafer, on side portions of the base wafer, and on end portions of an upper surface of the base wafer to apply a voltage to the bonding parts,
   wherein the bonding parts and the bonding counterparts are configured to receive the voltage to deform and bond to each other.

* * * * *